(12) United States Patent
Hirai et al.

(10) Patent No.: US 7,138,671 B2
(45) Date of Patent: Nov. 21, 2006

(54) SOLID-STATE IMAGE SENSOR WITH PHOTOELECTRIC CONVERSION UNITS EACH HAVING A FIRST CONDUCTIVE-TYPE IMPURITY REGION BOUNDARY NON-COPLANAR WITH SECOND CONDUCTIVE-TYPE IMPURITY REGION BOUNDARIES

(75) Inventors: Jun Hirai, Sakai (JP); Tooru Yamada, Oota-ku (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 11/137,414

(22) Filed: May 26, 2005

(65) Prior Publication Data
US 2006/0076587 A1 Apr. 13, 2006

(30) Foreign Application Priority Data
Oct. 8, 2004 (JP) .............................. 2004-296777

(51) Int. Cl.
*H01L 27/148* (2006.01)

(52) U.S. Cl. ...................... 257/222; 257/213; 257/215; 257/216; 257/E27.13

(58) Field of Classification Search ..................... None
See application file for complete search history.

(56) References Cited

FOREIGN PATENT DOCUMENTS

| JP | 7-142696 | 6/1995 |
|---|---|---|
| JP | 10-050976 | 2/1998 |

*Primary Examiner*—Nathan J. Flynn
*Assistant Examiner*—Kevin Quinto
(74) *Attorney, Agent, or Firm*—Wenderoth, Lind & Ponack, L.L.P.

(57) ABSTRACT

A first $p^+$-type region on a surface of a photodiode unit is formed over a region from a surface of the photodiode unit through a surface of a signal charge read-out unit until reaching the charge transfer unit. Also, the following structure is adapted: the structure in which a boundary between the first $p^+$-type region and a $p^{++}$-type region is not on a same plane with a boundary of an n-type impurity region which forms the photodiode unit on a side of the signal charge read-out unit. Further, a second $p^+$-type region is formed between the first $p^+$-type region and the $p^{++}$-type region on the surface of the photodiode unit. The second $p^+$-type region has an impurity concentration between the impurity concentrations of the first $p^+$-type region and the $p^{++}$-type region.

6 Claims, 3 Drawing Sheets

SOLID-STATE IMAGE SENSOR WITH PHOTOELECTRIC CONVERSION UNITS EACH HAVING A FIRST CONDUCTIVE-TYPE IMPURITY REGION BOUNDARY NON-COPLANAR WITH SECOND CONDUCTIVE-TYPE IMPURITY REGION BOUNDARIES

BACKGROUND OF THE INVENTION (1) Field of the Invention

This invention relates to a solid-state image sensor for a Charge-Coupled Device (CCD), in particular to a solid-state image sensor with high pixel density or a solid-state image sensor having miniaturized chips.

(2) Description of the Related Art

Hereafter, a conventional solid-state image sensor is described. FIG. 1A is a cross-section diagram of a conventional interline-type solid-state image sensor. As shown in FIG. 1A, the solid-state image sensor is made up of an n-type silicon substrate 1, a $p^{---}$-type well region 2, an n-type charge storage region 3, a $p^{++}$-type region 4 formed on the n-type charge storage region 3, a $p^+$-type region 5 formed on the n-type charge storage region 3 so as to horizontally surround the $p^{++}$-type region 4, an n-type buried channel region 7, a $p^-$-type region 6 formed under the n-type buried channel region 7, a read-out gate electrode 8 formed by a polysilicon film and the like, a $p^+$-type signal charge read-out region 9, a p-type region 10, and a light-shielding film 11 such as an aluminum film.

A portion of the $p^{---}$-type well region 2 under the n-type charge storage region 3 and the n-type charge storage region 3 form a photodiode unit (photoelectric conversion unit). The $p^{++}$-type region 4 and the $p^+$-type region 5 restrain dark current. The $p^-$-type region 6 controls smear. The n-type buried channel region 7 forms a charge transfer unit for transferring signal charge which is obtained through photoelectric conversion performed by the photodiode unit. The read-out gate electrode 8 reads out signal charge from the n-type charge storage region 3 to the n-type buried channel region 7 by applying voltage. The $p^+$-type signal charge read-out region 9 controls a read-out voltage. The $p^+$-type region 10 forms a channel stopper. The above is disclosed in Japanese Laid-Open Patent Publication No. 7-142696 and in Japanese Laid-Open Patent Publication No. 10-50976.

In general, due to an increase of intensity of an electric field of a read-out path following a development of micropixel size, and an increase of intensity of an electric field between a silicon substrate and a gate insulating film following a development of thinner gate insulating film, hot carriers generated at the time of reading are injected in the gate insulating film causing an increase of the threshold voltage. Consequently, higher read-out voltage is needed with the light irradiation. Therefore, all of the charge is not read with normal voltage and remaining charge is generated. Accordingly, such reliability loss is caused.

In the mentioned conventional solid-state image sensor, in order to prevent the threshold voltage from increasing, an offset (not to be adjacent to each other) is formed between the $P^+$-type region 5 and the n-type buried channel region 7. However, in order to prevent the threshold voltage from increasing with the light irradiation, if the impurity concentration of the $P^+$-type signal charge read-out region 9 is decreased and the read-out voltage is reduced, the surface of the substrate on the top of the $p^+$-type signal charge read-out region 9 which is the offset region is depleted, and dark current is increased in the charge transfer unit.

FIG. 1B shows a potential profile for electrons between X–X' on the cross-section of the solid-state image sensor shown in FIG. 1A. In the range of X–X', the section a is a section between the $p^+$-type region 5 and the n-type buried channel region 7, and the section b and c respectively correspond to the $p^+$-type region 5 and the $P^{++}$-type region 4. As shown in FIG. 1A, in the conventional solid-state image sensor, a boundary (A) of the $p^+$-type region 5 on the side of a signal charge read-out unit matches a boundary (B) of the n-type charge storage region 3 on the side of the signal charge read-out unit. Herein, as shown in the potential profile of FIG. 1B, a potential barrier against the electrons on the impurity concentration boundary (indicating boundary (A) and (B)) d and the remaining charge q is generated. In order to completely read out the remaining charge, it is necessary to increase the read-out voltage.

As a result, the conventional structure cannot simultaneously prevent degradation of image luminance by the remaining charge and generation of noise on the image by the generation of dark current.

SUMMARY OF THE INVENTION

In order to solve the mentioned problems, an object of the present invention is to provide a solid-state image sensor which is highly reliable, and prevents degradation of image brightness by the remaining charge.

In order to attain the objective, a solid-state image sensor according to the present invention comprises: photoelectric conversion units operable to photoelectrically convert incident light into signal charge, and to store the signal charge, the photoelectric conversion units being arranged two-dimensionally on a semiconductor substrate; a charge transfer unit operable to transfer the signal charge read from the photoelectric conversion unit; and a charge read-out unit operable to read out the signal charge stored in the photoelectric conversion unit to the charge transfer unit. The charge read-out unit is formed between the photoelectric conversion unit and the charge transfer unit. Each of the photoelectric conversion units includes: first conductive-type impurity regions formed on a surface of the semiconductor substrate; and a second conductive-type impurity region formed under the first conductive-type impurity regions. A boundary of the second conductive-type impurity region on a side of the charge read-out unit is not on a same plane with any of boundaries of the first conductive-type impurity regions on the side of the charge read-out unit.

Thus, in the solid-state image sensor according to the present invention, a boundary of the second conductive-type impurity region on the side of the charge read-out unit is not on the same plane with any of boundaries of the first conductive-type impurity regions. Therefore, formation of the potential barrier, as shown in FIG. 1B, against electrons in a boundary of the regions can be prevented. Consequently, the generation of noise on the picture due to the generation of dark current can be suppressed.

Here, one of the first conductive-type impurity regions may be formed over a region from a portion of a surface of the photoelectric conversion unit through a surface of the charge read-out unit until reaching the charge transfer unit.

According to this structure, by forming one first conductive-type impurity region so as to cover a region from the portion of the surface of the photoelectric conversion to the charge transfer unit, there are effects that a deletion on the substrate surface can be controlled and that an increase of the charge transfer unit dark current can be controlled.

Consequently, the generation of noise on the picture due to the generation of dark current can be suppressed.

Here, one of the first conductive-type impurity regions may be formed so as to be horizontally surrounded with other first conductive-type impurity regions on the surface of the semiconductor substrate, and has a higher impurity concentration and a deeper impurity diffusion depth than the other first conductive-type impurity regions.

According to this structure, there is an effect that smear can be reduced by setting an impurity concentration of the one first conductive-type impurity region higher than other regions and diffusion depth of the region is deeper than other regions.

Here, a first region may be formed so as to be horizontally surrounded with a second region on the surface of the semiconductor substrate, the first region having a higher impurity concentration than and a same impurity diffusion depth with the second region, and each of the first and second regions being one of the first conductive-type impurity regions. A third region is formed so as to be horizontally surrounded with the first region on the surface of the semiconductor substrate, the third region having a higher impurity concentration and a deeper impurity diffusion depth than the first region, and being one of the first conductive-type impurity regions.

According to this structure, there is an effect that a decrease of remaining charge can be encouraged by setting the first conductive-type impurity regions as regions, each having one of the three-types of impurity concentrations.

Here, a boundary of one of the first conductive-type impurity regions on the other side of the charge read-out unit may be formed offset towards an inner side of a boundary of the second conductive-type impurity region on the other side of the charge read-out unit, the one of the first conductive-type impurity regions having a highest impurity concentration among the first conductive-type impurity regions.

According to this structure, there is an effect that a potential gradient in the case where signal charge is read out can be moderated by forming a boundary of the first conductive-type impurity region on the opposite side of the charge read-out unit offset towards an inner side of a boundary of the second conductivity-type impurity region on the opposite side of the charge read-out unit, the first conductive-type impurity region having the highest impurity concentration among the first conductive-type impurity regions.

Here, an impurity concentration of the first conductive-type impurity region having a highest impurity concentration may be fifteen times higher than the adjacent first conductive-type impurity region.

According to this structure, there is an effect that smear can be reduced by setting the impurity concentration of the first conductive-type impurity region having the highest impurity concentration fifteen times higher than the adjacent region.

Here, an impurity concentration of one of the first conductive-type impurity regions other than a region having a highest impurity concentration may be same as an impurity concentration of the second conductive-type impurity region which forms the photoelectric conversion unit.

According to this structure, there is an effect that the dark current can be controlled by setting the impurity concentration of one of the first conductive-type impurity regions other than the region having the highest impurity concentration to be equal to the impurity concentration of the second conductive-type impurity region.

According to the solid-state image sensor of the present invention, the voltage of reading out signal charge from the photodiode unit to the charge transfer unit is reduced and the read-out of signal charge at the photodiode unit is effectively performed while restraining the read-out remaining of the signal charge. At the same time, the depletion on the substrate surface above the signal charge read-out unit is prevented and an increase of the dark current at the charge transfer unit is controlled. Consequently, an increase of read-out voltage with the light irradiation can be suppressed.

For further information about technical background for this application, the disclosure of Japanese Patent Application No. 2004-296777 filed on Oct. 8, 2004 including specification, drawings and claims is incorporated herein by reference in its entirety.

BRIEF DESCRIPTION OF THE DRAWINGS

These and other objects, advantages and features of the invention will become apparent from the following description thereof taken in conjunction with the accompanying drawings that illustrate a specific embodiment of the invention. In the Drawings.

DESCRIPTION OF THE PREFERRED EMBODIMENT(S)

Hereafter, embodiments of the present invention are described with references to FIGS. 2A and 2B and FIGS. 3A and 3B.

First Embodiment

Figure 1A:
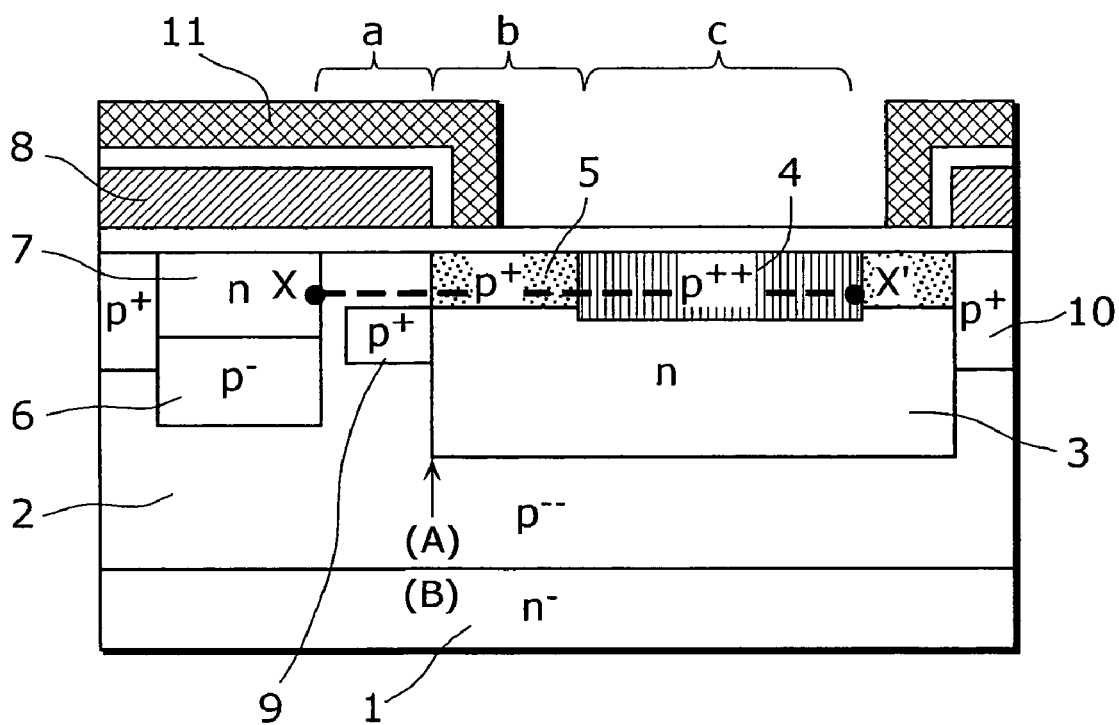
FIG. 1A is a cross-section diagram of a conventional interline-type solid-state image sensor.
Figure 1B:
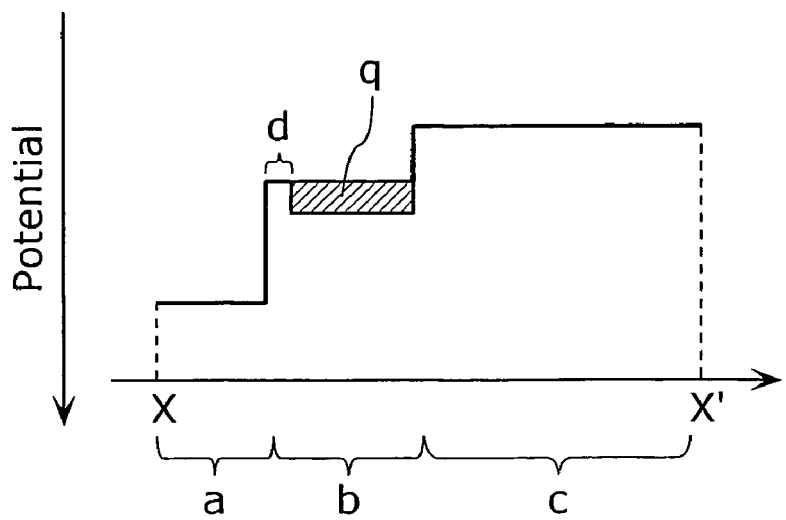
FIG. 1B is a potential profile for electrons between X–X'.
Figure 2A:
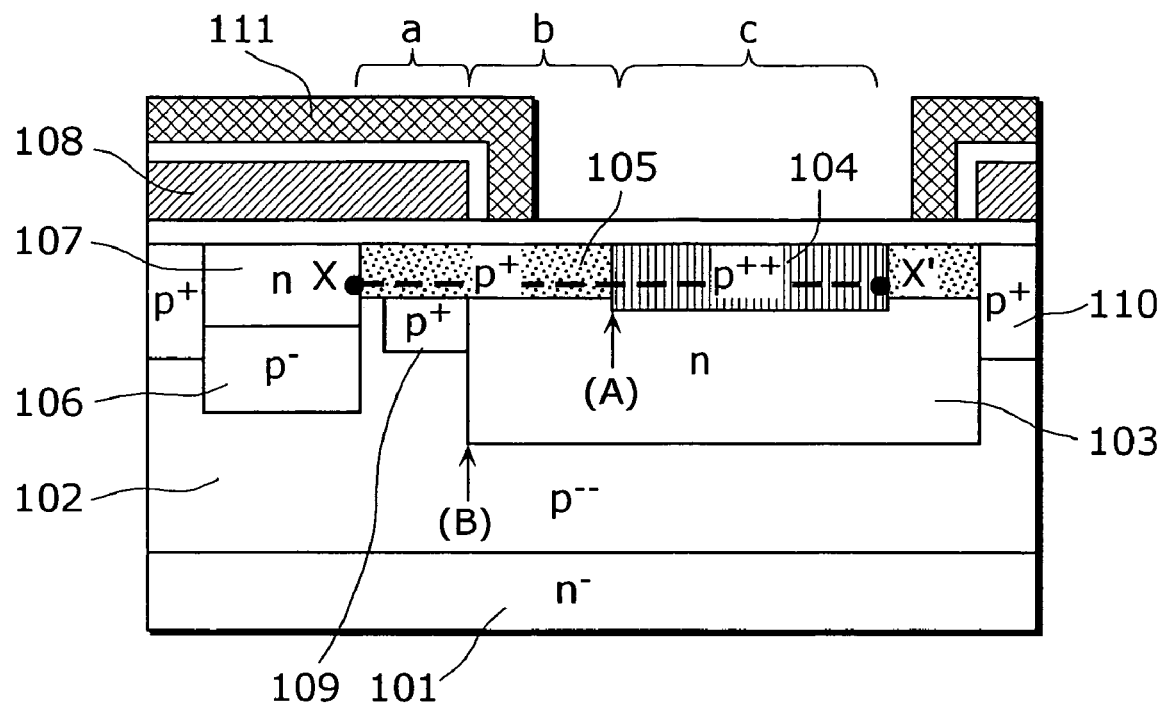
FIG. 2A is a cross-section diagram of a solid-state image sensor in a first embodiment of the present invention.

FIG. 2A is a cross-section diagram of a solid-state image sensor in the first embodiment of the present invention. As shown in FIG. 2A, the solid-state image sensor is made up of an n-type silicon substrate 101, a $p^{---}$-type well region 102, an n-type charge storage region 103, a $p^{++}$-type region 104 formed on the n-type charge storage region 103, a $p^{+}$-type region 105 formed on the n-type charge storage region 103 so as to surround the $p^{++}$-type region 104, an n-type buried channel region 107, a $p^{-}$-type region 106 formed under the n-type buried channel region 107, a read-out gate electrode 108 formed of a polysilicon film or the like, a p-type signal charge read-out region 109, a $p^{+}$-type region 110, and a light-shielding film 111 such as an aluminum film.

A portion of the $p^{---}$-type well region 102 under the n-type charge storage region 103 and the n-type charge storage region 103 forms a photodiode unit (photoelectric conversion unit). The $p^{++}$-type region 104 and the $p^{+}$-type region 105 suppress dark current. The $p^{-}$-type region 106 controls smear. The n-type buried channel region 107 forms a charge transfer unit for transferring signal charge obtained through photoelectric conversion performed by the photodiode unit. The read-out gate electrode 108 reads out light detection signal charge from the n-type charge storage region 103 to the n-type buried channel region 107 by applying voltage.

The p$^+$-type signal charge read-out region 109 controls the read-out voltage. The p$^+$-type region 110 forms a channel stopper.

In the present embodiment, the p$^+$-type region 105 and the p$^{++}$-type region 104 for controlling dark current are formed on the n-type charge storage region 103, and formed so as to cover a region from a surface of the photodiode unit through a surface of the signal charge read-out unit until reaching the charge transfer unit. Accordingly, a depletion of the substrate surface above the P$^+$-type signal charge read-out region 109 can be controlled and the charge transfer unit dark current can be prevented from increasing.

Such structure can be obtained by the following processes. First, the p$^{---}$-type well region 102 is formed on the n-type silicon substrate 101. Then, the following regions are sequentially formed using two or more ion implantation prevention masks (not shown in the diagram): the n-type charge storage region 103; the p$^-$-type region 106; the p$^+$-type signal charge read-out region 109; the n-type buried channel region 107; and the p$^+$-type region 110. Next, the p$^+$-type region 105 is formed to cover a surface of the n-type charge storage region 103 and a surface of the read-out region 109 using the ion implantation prevention mask. Following that, the p$^{++}$-type region 104 for controlling dark current is formed at the inner side of the p$^+$-type region 105 using another ion implantation prevention mask. After that, the read-out gate electrode 108 and the light shielding film 111 are formed.

Figure 2B:
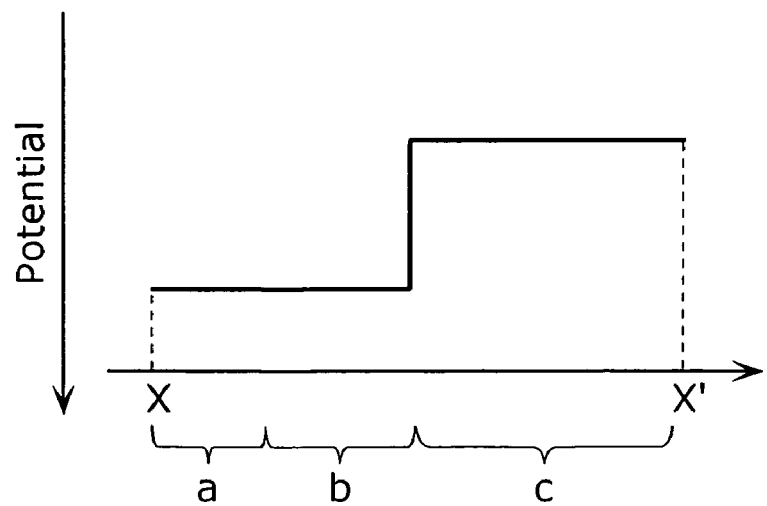
FIG. 2B is a potential profile for electrons between X–X'.

FIG. 2B is a potential profile for electrons between X–X' on the cross-section of the solid-state image sensor shown in FIG. 2A. In the X–X' section, the sections a and b and the section c respectively correspond to the p$^+$-type region 105 and the p$^{++}$-type region 104. By placing a boundary (A) between the p$^+$-type region 105 and the p$^{++}$-type region 104 not on a same plane as a boundary (B) of the n-type charge storage region 103 on the side of the signal charge read-out unit, a potential barrier for electrons is prevented from being formed on the impurity concentration boundary and the read-out voltage can be reduced, as shown in FIG. 2B.

In addition, by setting the impurity concentration of the p$^+$-type region 105 to be equal to the impurity concentration of the n-type charge storage region 103, the silicon substrate and a boundary of the gate insulating film can be efficiently buried with holes and the dark current can be suppressed.

Further, smear can be reduced by setting the impurity concentration of the P$^{++}$-type region 104 fifteen times or more higher than the impurity concentration of the p$^+$-type region 105 and the depth of the p$^{++}$-type region 104 deeper than the p$^+$-type region 105. Furthermore, the p$^{++}$-type region 104 is formed offset with respect to the p$^+$-type region 110 (channel stopper) so that the potential gradient in the case of reading the signal charge can be moderated. This is verified by a computer simulation.

According to the present embodiment, the degradation of picture brightness by the remaining charge can be controlled by reducing noise by reducing the dark current and reducing the read-out voltage.

Second Embodiment

Figure 3A:
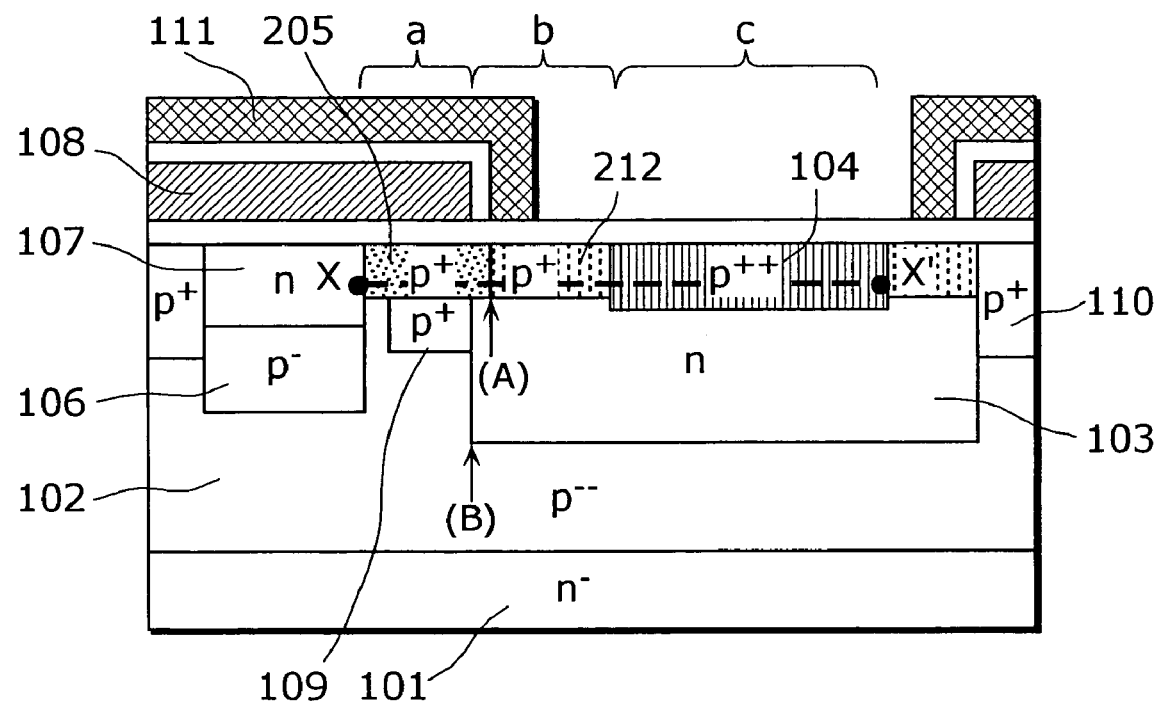
FIG. 3A is a cross-section diagram of a solid-state image sensor in a second embodiment of the present invention.

FIG. 3A is a cross-section diagram of a solid-state image sensor in the second embodiment of the present invention. The same reference characters are attached to the same constituents as in the first embodiment and the explanations are omitted in here. As shown in FIG. 3A, the present embodiment differs from the first embodiment in that the p$^+$-type region 205 and the p$^{++}$-type region 104 for controlling the dark current formed on the n-type charge storage region 103 are formed so as to cover a region from the surface of the photodiode unit to the surface of the read-out unit, and that a p$^+$-type region 212 having an impurity concentration which is higher than an impurity concentration of the p$^+$-type region 205 and lower than an impurity concentration of the p$^{++}$-type region 104 is formed between the p$^+$-type region 205 and the p$^{++}$-type region 104.

Thus, the remaining charge and the read-out voltage can be reduced by having a structure in which the potential level for electrons is gradually lowered towards a direction from the side of photodiode unit to the side of the read-out region.

Such structure can be obtained by the following processes. First, the p$^{---}$-type well region 102 is formed on the n-type silicon substrate 101. Then, the following regions are sequentially formed using two or more ion implantation prevention masks (not shown in the diagram): the n-type charge storage region 103; the p$^-$-type region 106; the p$^+$-type signal charge read-out region 109; the n-type buried channel region 107; and the p$^+$-type region 110. Next, the p$^+$-type region 205 is formed to cover the surface of the n-type charge storage region 103 and the surface of the read-out region 109 using the ion implantation prevention masks. Following that, the p$^+$-type region 212 is formed at an inner side of the p$^+$-type region 205 using new ion implantation prevention masks (not shown in the diagram). Furthermore, the p$^{++}$-type region 104 is formed at the inner side of the formed p$^+$-type region 212 using other new ion implantation prevention masks. After that, the read-out gate electrode 108 and the light-shielding film 111 are formed.

Figure 3B:
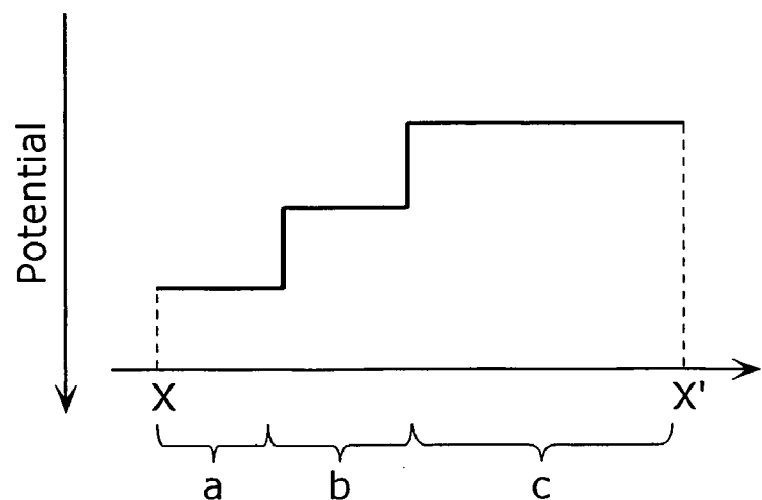
FIG. 3B is a potential profile for electrons between X–X'.

FIG. 3B is a potential profile for electrons between X–X' on the cross-section of the solid-state image sensor shown in FIG. 3A. In X–X', the sections a, b, and c respectively correspond to the p$^+$-type region 205, the p$^+$-type region 212, and the p$^{++}$-type region 104. By placing a boundary (A) between the p$^+$-type region 205 and the p$^+$-type region 212 not on a same plane as a boundary (B) of the n-type charge storage region 103 on the side of the signal charge read-out unit, as shown in FIG. 3B, the potential barrier for electrons on the impurity concentration boundary is prevented from being formed and the read-out voltage can be reduced.

Further, by setting the impurity concentration of the p$^+$-type region 212 to be equal to the impurity concentration of the n-type charge storage region 103, the silicon substrate and the gate insulating film boundary can be efficiently buried with holes and the dark current can be controlled. Or, by setting the impurity concentration of one of the p$^+$-type impurity regions other than the highest impurity concentration region to be equal to the impurity concentration of the n-type impurity region 103, the silicon substrate and the gate insulating film boundary can be efficiently buried with holes and the dark current can be restrained.

Further, the smear can be reduced by increasing the impurity concentration of the p$^{++}$-type region 104 fifteen times or more higher than the impurity concentrations of the p$^+$-type region 205 and the p$^+$-type region 212, and by making the depth of the p$^{++}$-type region 104 greater than the depths of the p$^+$-type region 205 and the p$^+$-type region 212. Furthermore, by offsetting the p$^{++}$-type region 104 having the highest impurity concentration with respect to the p$^+$-type region 110 (channel stopper) on the other side of the charge read-out unit, the potential gradient at the time of reading out signal charge can be moderated. This is verified by a computer simulation.

Compared to the first embodiment, in the present embodiment, the degradation of the picture brightness can be controlled by further reducing the remaining charge.

Note that conductive types of p-type and n-type regions of the solid-state image sensor in the embodiments may be reversely configured.

Although the present invention has been fully described by way of examples with reference to the accompanying drawings, it is to be noted that various changes and modifications will be apparent to those skilled in the art. Therefore, unless otherwise such changes and modifications depart from the scope of the present invention, they should be construed as being included therein.

What is claimed is:

1. A solid-state image sensor comprising:
   photoelectric conversion units operable to photoelectrically convert incident light into signal charge, and to store the signal charge, said photoelectric conversion units being arranged two-dimensionally on a semiconductor substrate;
   a charge transfer unit operable to transfer the signal charge read from said photoelectric conversion unit; and
   a charge read-out unit operable to read out the signal charge stored in said photoelectric conversion unit to said charge transfer unit, said charge read-out unit being formed between said photoelectric conversion unit and said charge transfer unit;
   wherein each of said photoelectric conversion units includes
   first conductive-type impurity regions formed on a surface of said semiconductor substrate and having boundaries on the side of said charge read-out unit, and
   a second conductive-type impurity region formed under the first conductive-type impurity regions,
   wherein a boundary of the second conductive-type impurity region on a side of said charge read-out unit is not on a same plane with any of the boundaries of the first conductive-type impurity regions on the side of said charge read-out unit, and
   wherein one of the first conductive-type impurity regions is formed over a region from a portion of a surface of said photoelectric conversion unit through a surface of said charge read-out unit until reaching said charge transfer unit.

2. A solid-state image sensor comprising:
   photoelectric conversion units operable to photoelectrically convert incident light into signal charge, and to store the signal charge, said photoelectric conversion units being arranged two-dimensionally on a semiconductor substrate;
   a charge transfer unit operable to transfer the signal charge read from said photoelectric conversion unit; and
   a charge read-out unit operable to read out the signal charge stored in said photoelectric conversion unit to said charge transfer unit, said charge read-out unit being formed between said photoelectric conversion unit and said charge transfer unit;
   wherein each of said photoelectric conversion units includes
   first conductive-type impurity regions formed on a surface of said semiconductor substrate and having boundaries on the side of said charge read-out unit, and
   a second conductive-type impurity region formed under the first conductive-type impurity regions,
   wherein a boundary of the second conductive-type impurity region on a side of said charge read-out unit is not on a same plane with any of the boundaries of the first conductive-type impurity regions on the side of said charge read-out unit, and
   wherein one of the first conductive-type impurity regions is formed so as to be horizontally surrounded with other first conductive-type impurity regions on the surface of the semiconductor substrate, and has a higher impurity concentration and a deeper impurity diffusion depth than the other first conductive-type impurity regions.

3. A solid-state image sensor comprising:
   photoelectric conversion units operable to photoelectrically convert incident light into signal charge, and to store the signal charge, said photoelectric conversion units being arranged two-dimensionally on a semiconductor substrate;
   a charge transfer unit operable to transfer the signal charge read from said photoelectric conversion unit; and
   a charge read-out unit operable to read out the signal charge stored in said photoelectric conversion unit to said charge transfer unit, said charge read-out unit being formed between said photoelectric conversion unit and said charge transfer unit;
   wherein each of said photoelectric conversion units includes
   first conductive-type impurity regions formed on a surface of said semiconductor substrate and having boundaries on the side of said charge read-out unit, and
   a second conductive-type impurity region formed under the first conductive-type impurity regions,
   wherein a boundary of the second conductive-type impurity region on a side of said charge read-out unit is not on a same plane with any of the boundaries of the first conductive-type impurity regions on the side of said charge read-out unit,
   wherein a first region is formed so as to be horizontally surrounded with a second region on the surface of the semiconductor substrate, the first region having a higher impurity concentration than and a same impurity diffusion depth with the second region, and each of the first and second regions being one of the first conductive-type impurity regions, and
   wherein a third region is formed so as to be horizontally surrounded with the first region on the surface of the semiconductor substrate, the third region having a higher impurity concentration and a deeper impurity diffusion depth than the first region, and the third region being one of the first conductive-type impurity regions.

4. A solid-state image sensor comprising:
   photoelectric conversion units operable to photoelectrically convert incident light into signal charge, and to store the signal charge, said photoelectric conversion units being arranged two-dimensionally on a semiconductor substrate;
   a charge transfer unit operable to transfer the signal charge read from said photoelectric conversion unit; and
   a charge read-out unit operable to read out the signal charge stored in said photoelectric conversion unit to said charge transfer unit, said charge read-out unit being formed between said photoelectric conversion unit and said charge transfer unit;
   wherein each of said photoelectric conversion units includes
   first conductive-type impurity regions formed on a surface of said semiconductor substrate and having boundaries on the side of said charge read-out unit, and a second conductive-type impurity region formed under the first conductive-type impurity regions, wherein a boundary of the second conductive-type impurity region on a side of said charge read-out unit is not on a same plane with any of the boundaries of the first conductive-type impurity regions on the side of said charge read-out unit, and wherein a boundary of one of the first conductive-type impurity regions on the other side of said charge read-out unit is formed offset towards an inner side of a boundary of the second conductive-type impurity region on the other side of said charge read-out unit, said one of the first conductive-type impurity regions having a highest impurity concentration among the first conductive-type impurity regions.

5. A solid-state image sensor comprising:

photoelectric conversion units operable to photoelectrically convert incident light into signal charge, and to store the signal charge, said photoelectric conversion units being arranged two-dimensionally on a semiconductor substrate;

a charge transfer unit operable to transfer the signal charge read from said photoelectric conversion unit; and a charge read-out unit operable to read out the signal charge stored in said photoelectric conversion unit to said charge transfer unit, said charge read-out unit being formed between said photoelectric conversion unit and said charge transfer unit;

wherein each of said photoelectric conversion units includes first conductive-type impurity regions formed on a surface of said semiconductor substrate and having boundaries on the side of said charge read-out unit, and a second conductive-type impurity region formed under the first conductive-type impurity regions, wherein a boundary of the second conductive-type impurity region on a side of said charge read-out unit is not on a same plane with any of the boundaries of the first conductive-type impurity regions on the side of said charge read-out unit, and wherein an impurity concentration of the first conductive-type impurity region having a highest impurity concentration is fifteen times higher than the adjacent first conductive-type impurity region.

6. A solid-state image sensor comprising:

photoelectric conversion units operable to photoelectrically convert incident light into signal charge, and to store the signal charge, said photoelectric conversion units being arranged two-dimensionally on a semiconductor substrate;

a charge transfer unit operable to transfer the signal charge read from said photoelectric conversion unit; and a charge read-out unit operable to read out the signal charge stored in said photoelectric conversion unit to said charge transfer unit, said charge read-out unit being formed between said photoelectric conversion unit and said charge transfer unit;

wherein each of said photoelectric conversion units includes first conductive-type impurity regions formed on a surface of said semiconductor substrate and having boundaries on the side of said charge read-out unit, and a second conductive-type impurity region formed under the first conductive-type impurity regions, wherein a boundary of the second conductive-type impurity region on a side of said charge read-out unit is not on a same plane with any of the boundaries of the first conductive-type impurity regions on the side of said charge read-out unit, and wherein an impurity concentration of one of the first conductive-type impurity regions other than a region having a highest impurity concentration is same as an impurity concentration of the second conductive-type impurity region which forms said photoelectric conversion unit.

* * * * *